(12) United States Patent  
Tegen et al.

(10) Patent No.: US 9,368,408 B2  
(45) Date of Patent: Jun. 14, 2016

(54) METHOD OF MANUFACTURING A SEMICONDUCTOR DEVICE WITH BURIED CHANNEL/BODY ZONE AND SEMICONDUCTOR DEVICE

(71) Applicant: Infineon Technologies Dresden GmbH, Dresden (DE)

(72) Inventors: Stefan Tegen, Dresden (DE); Marko Lemke, Dresden (DE); Rolf Weis, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 27 days.

(21) Appl. No.: 14/141,839

(22) Filed: Dec. 27, 2013

(65) Prior Publication Data

US 2015/0187654 A1    Jul. 2, 2015

(51) Int. Cl.
| | |
|---|---|
| H01L 21/336 | (2006.01) |
| H01L 21/8234 | (2006.01) |
| H01L 21/8236 | (2006.01) |
| H01L 27/088 | (2006.01) |

(52) U.S. Cl.
CPC .... *H01L 21/823412* (2013.01); *H01L 21/8236* (2013.01); *H01L 21/823418* (2013.01); *H01L 21/823431* (2013.01); *H01L 27/0883* (2013.01); *H01L 27/0886* (2013.01)

(58) Field of Classification Search
CPC ................ H01L 21/823487; H01L 29/7813
USPC ................ 257/368, 337, 499; 438/270, 243
See application file for complete search history.

(56) References Cited

U.S. PATENT DOCUMENTS

| | | | |
|---|---|---|---|
| 8,598,655 B1 * | 12/2013 | Schloesser et al. | 257/334 |
| 8,980,714 B2 * | 3/2015 | Lemke | H01L 21/823437 |
| | | | 257/331 |
| 2013/0292805 A1 * | 11/2013 | Cai et al. | 257/622 |
| 2014/0206157 A1 * | 7/2014 | Baldauf et al. | 438/156 |
| 2015/0001629 A1 * | 1/2015 | Tegen | 257/368 |

OTHER PUBLICATIONS

Jovanovic, V. et al. "Crystallographic Silicon-Etching for Ultra-High Aspect-Ratio FinFET." ECS Trans. 2008, vol. 13, Issue 1, pp. 313-320.

Tegen, S. "Semiconductor Device." U.S. Appl. No. 13/932,564, filed Jul. 1, 2013.

* cited by examiner

*Primary Examiner* — Bradley K Smith  
*Assistant Examiner* — David Goodwin  
(74) *Attorney, Agent, or Firm* — Murphy, Bilak & Homiller, PLLC

(57) ABSTRACT

A semiconductor device includes a source zone of a first conductivity type formed in a first electrode fin that extends from a first surface into a semiconductor portion. A drain region of the first conductivity type is formed in a second electrode fin that extends from the first surface into the semiconductor portion. A channel/body zone is formed in a transistor fin that extends between the first and second electrode fins at a distance to the first surface. The first and second electrode fins extend along a first lateral direction. A width of first gate sections, which are arranged on opposing sides of the transistor fin, along a second lateral direction perpendicular to the first lateral direction is greater than a distance between the first and second electrode fins.

10 Claims, 13 Drawing Sheets

METHOD OF MANUFACTURING A SEMICONDUCTOR DEVICE WITH BURIED CHANNEL/BODY ZONE AND SEMICONDUCTOR DEVICE

BACKGROUND

Power semiconductor devices typically include a drift zone between a voltage-controlled channel/body region and a drain region. Increasing the length of the drift zone increases the voltage blocking capability but at the same time increases the on-state resistance. FET (field effect transistors) concepts like ADZFETs (active drift zone FETs) arrange two or more field effect transistors in series in the same semiconductor die to combine low-on-state resistance with high blocking capability. In vertical ADZFETs a load current through the drift zone of two or more transistor components flows in substance in a vertical direction with respect to the main surfaces of the ADZFET semiconductor dies. It is desirable to provide semiconductor devices and methods of manufacturing semiconductor devices with low variations of the device characteristics from target characteristics.

SUMMARY

In accordance with an embodiment, a semiconductor device includes a source zone of a first conductivity type formed in a first electrode fin that extends from a first surface into a semiconductor portion. A drain region of the first conductivity type is formed in a second electrode fin that extends from the first surface into the semiconductor portion. A channel/body zone is formed in a transistor fin that extends between the first and second electrode fins at a distance to the first surface. The first and second electrode fins extend along a first lateral direction. The width of first gate sections, which are arranged on opposing sides of the transistor fin, along a second lateral direction perpendicular to the first lateral direction is greater than a distance between the first and second electrode fins.

In accordance with an embodiment a method of manufacturing a semiconductor device includes etching cavities into a semiconductor substrate by crystallographic etching having an etch rate that depends upon an orientation of crystal faces. A transistor fin is formed between two of the cavities at a distance to a first surface of the semiconductor substrate. A channel/body zone of a transistor cell is formed in the transistor fin. Source and drain zones of the transistor cell are formed in the semiconductor substrate, wherein junctions between the channel/body zone and the source zone and between the channel/body zone and the drain zone are formed at a distance to the first surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
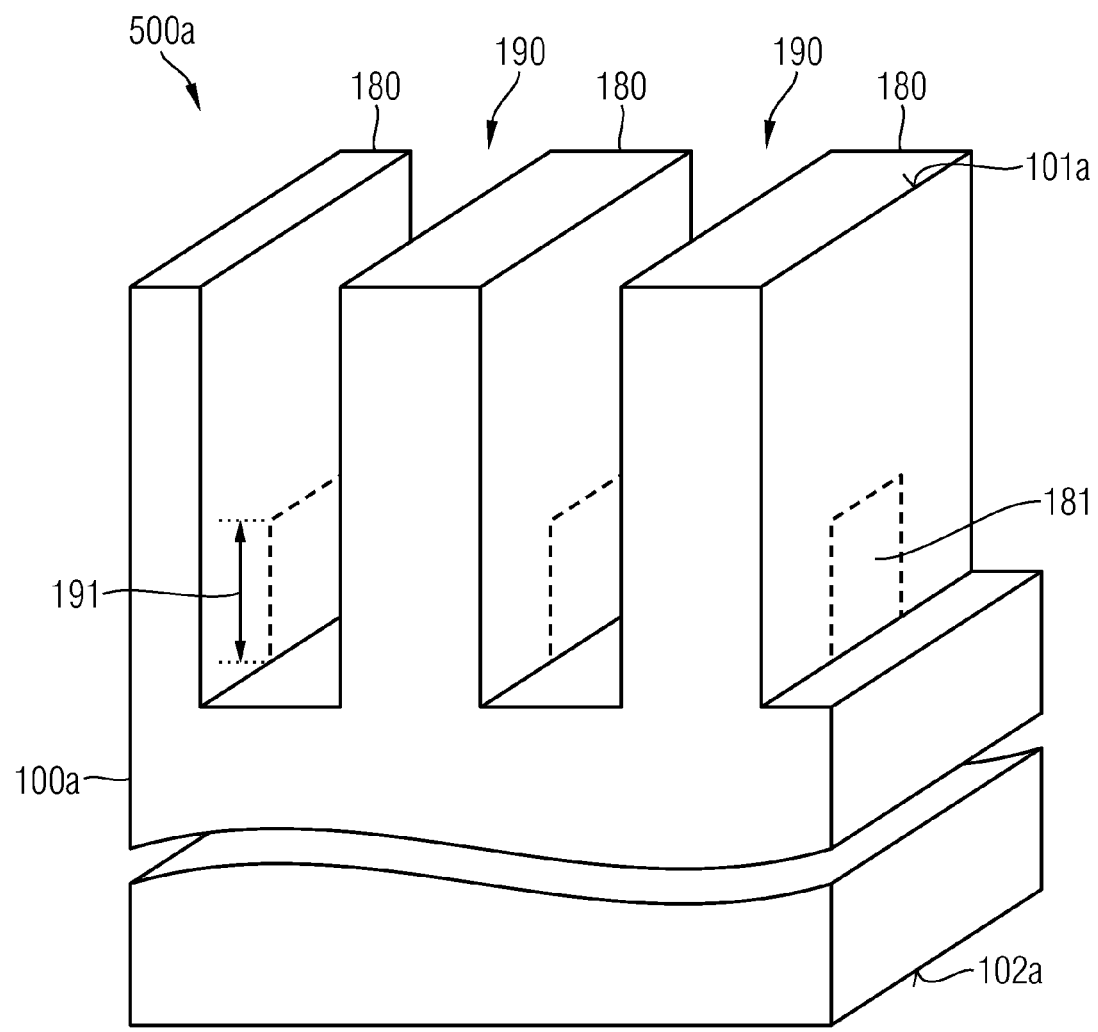
FIG. 1A refers to an embodiment of a method of manufacturing a semiconductor device and shows a perspective view of a semiconductor substrate portion after etching cavities and forming transistor fins.
Figure 1B:
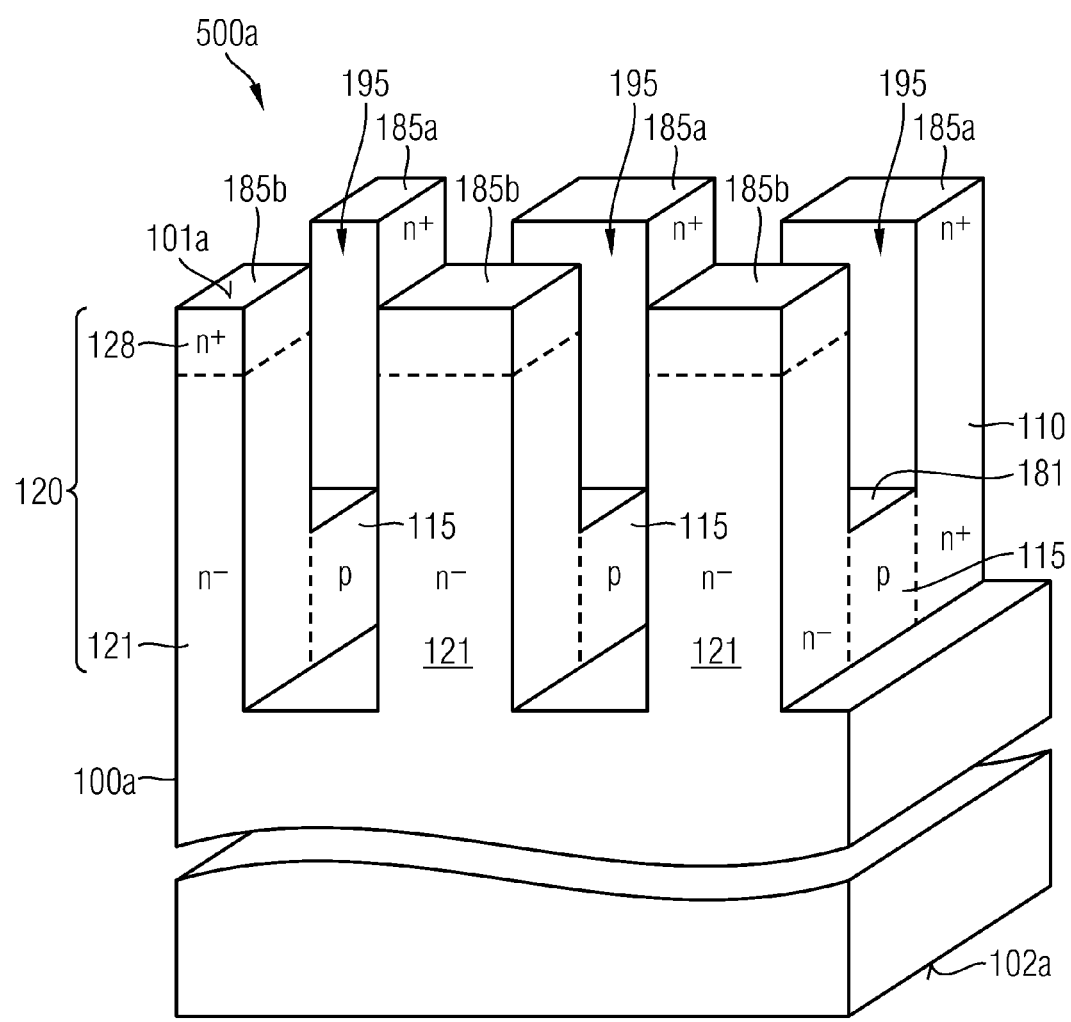
FIG. 1B is a schematic perspective view of the semiconductor substrate portion of FIG. 1A after forming electrode fins.
Figure 1C:
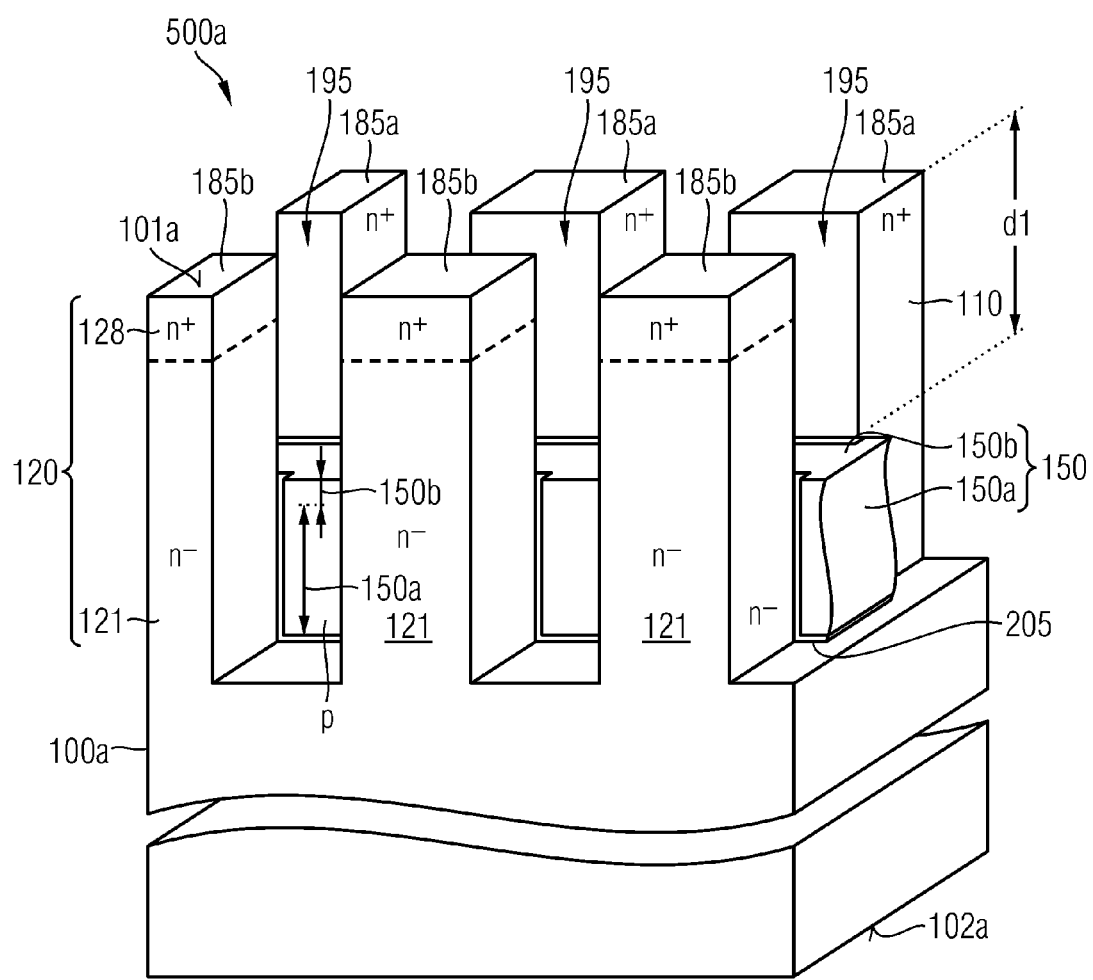
FIG. 1C is a schematic perspective view of the semiconductor substrate portion of FIG. 1B after forming gate electrodes.

FIGS. 1A to 1C refer to a sequence of processes providing channel/body zones of transistor cells in transistor fins resulting from crystallographic etching, wherein junctions between the channel/body zones and source zones as well as junctions between the channel/body zones and drain zones of the transistor cell are buried in the semiconductor substrate at a distance to a first surface of the semiconductor substrate.

The semiconductor substrate 500a consists of or includes a semiconductor layer 100a of a single-crystalline semiconductor material, which may be silicon (Si), silicon carbide (SiC), germanium (Ge), a silicon germanium crystal (SiGe), gallium nitride (GaN) or gallium arsenide (GaAs), by way of example. According to an embodiment, the semiconductor substrate 500a may be a silicon wafer. According to another embodiment the semiconductor substrate 500a may be an SOI (silicon-on-insulator) wafer, e.g., an SOG (silicon-on-glass) wafer with the semiconductor layer 100a disposed on an insulator substrate. The semiconductor layer 100a may be grown by epitaxy at least in parts and may include two or more sub-layers differing in a mean impurity concentration, in the conductivity type, or both. The semiconductor substrate 500a may include further semiconducting and dielectric structures in addition to the semiconductor layer 100a.

The semiconductor layer 100a has a planar first surface 101a opposed to a second surface 102a of the semiconductor substrate 500a. A normal to the first and second surfaces 101a, 102a defines a vertical direction and directions orthogonal to the vertical direction are lateral directions.

Cell trenches 190 may be etched from the first surface 101a into the semiconductor layer 100a, wherein portions of the semiconductor layer 100a between the cell trenches 190 form cell fins 180. The formation of the cell trenches 190 may include several different sub-processes. At least one sub-process defining sidewall portions close to the bottom of the cell trenches 190 at a distance to the first surface 101 includes crystallographic etching having an etch rate that depends upon an orientation of crystal faces. The crystallographic etching forms cavities 191, which may be sections of the cell trenches 190, and transistor fins 181 between neighboring cavities 191, wherein the transistor fins 181 may be sections of the cell fins 180.

The cavities 191 may be regularly arranged parallel stripes extending along a first lateral direction. The widths of the cavities along a second lateral direction perpendicular to the first lateral direction may be equal. According to other embodiments, the cavities 191 may be compact cavities, wherein the widths along the first and second lateral directions are within the same order of magnitude such that the transistor fins 181 form a grid with the cavities 191 arranged in the meshes. According to yet another embodiment, the cavities 191 may form a rectangular grid with column-like transistor fins 181 arranged in the meshes.

According to an embodiment referring to a semiconductor layer 100a from silicon, the first surface 101a of the semiconductor layer 100a is a (110) crystal plane and the crystallographic etching is based on an alkaline solution, e.g., a TMAH (tetra-methyl-ammonium-hydroxide) solution or a KOH (potassium hydroxide) solution, or an EDP (ethylene di-amine pyro-catechol) solution, by way of example. Silicon etching in TMAH, KOH and EDP solutions is slow for {111} crystal planes compared to other crystal planes such that the sidewalls of the transistor fins 181 are vertical {111} crystal planes.

FIG. 1A shows transistor fins 181 separated by cavities 191, wherein due to the crystallographic etching the sidewalls of the transistor fins 181 perpendicular to the first surface 101a are approximately perfectly vertical. The cavities 191 are formed as portions of the cell trenches 190 formed between cell fins 180. The transistor fins 181 are formed as portions of the cell fins 180.

Channel/body zones 115 as well as source zones 110 and drain regions 120 may be formed by introducing impurities, by shaping the transistor fins 181 or by combining both. According to the illustrated embodiment, separation trenches 195 may be etched into the cell fins 180 to form, from sections of the cell fins 180, first electrode fins 185a including the source zones 110 and second electrode fins 185b including the drain regions 120.

FIG. 1B shows separation trenches 195 extending between the first surface 101a and the transistor fins 181. The source zones 110 are impurity regions of a first conductivity type and are formed in the first electrode fins 185a. The channel/body zones 115 are impurity regions of the first or a second, opposite conductivity type in the transistor fins 181 and directly adjoin the source zones 110. The drain regions 120 are impurity regions of the first conductivity type and include heavily doped contact zones 128 which may directly adjoin the first surface 101a as well as lightly doped drift zones 121 between the channel/body zones 115 and the contact zones 128, respectively.

For transistor components based on IGFET (insulated gate field effect transistor) cells, the channel/body zones 115 have the second conductivity type and a gate dielectric 205 may be formed at least in portions of the exposed surface of the semiconductor substrate 500a assigned to the channel/body zones 115. Formation of the gate dielectric 205 may include a thermal oxidation of the semiconductor material of the semiconductor layer 100a or the deposition of a dielectric material, for example silicon oxide, or both. According to an embodiment, forming the gate dielectric 205 includes a thermal oxidation of the semiconductor layer 100a, deposition of a silicon oxide using, e.g., TEOS (tetraethyl orthosilicate) as precursor material, as well as a further thermal treatment. Forming the gate dielectric 205 may also include the formation of a silicon nitride or silicon oxynitride layer and/or the deposition of further dielectric materials. For transistor components based on JFET (junction field effect transistor) cells, the channel/body zones 115 have the first conductivity type and formation of a gate dielectric is omitted.

A conductive gate material may be deposited on the gate dielectric 205 or, for JFET cells, directly on the channel/body zones 115. The conductive gate material may consist of heavily doped polycrystalline silicon and/or may include at least one layer containing a metal. The gate material may be recessed to reduce a vertical overlap with the source zones 110 and the drain regions 120.

FIG. 1C refers to IGFET cells with a gate dielectric 205 formed at least along the surfaces of the channel/body zones 115 and a gate electrode 150 formed from the conductive gate material. First gate sections 150a are formed in the cavities 191 on both sides of the transistor fins 181. A second gate section 150b between the first surface 101a and the channel/body zones 115 may structurally and electrically connect the first gate sections 150a.

The crystallographic etching provides approximately perfectly rectangular transistor fins 181 at a distance d1 to the first surface 101a. The electric characteristics, e.g., the transistor threshold voltages of individual transistor cells within a transistor cell array are to a high degree uniform. Semiconductor devices obtained from different wafers of a wafer lot or from wafers of different wafer lots show uniform characteristics.

Figure 2A:
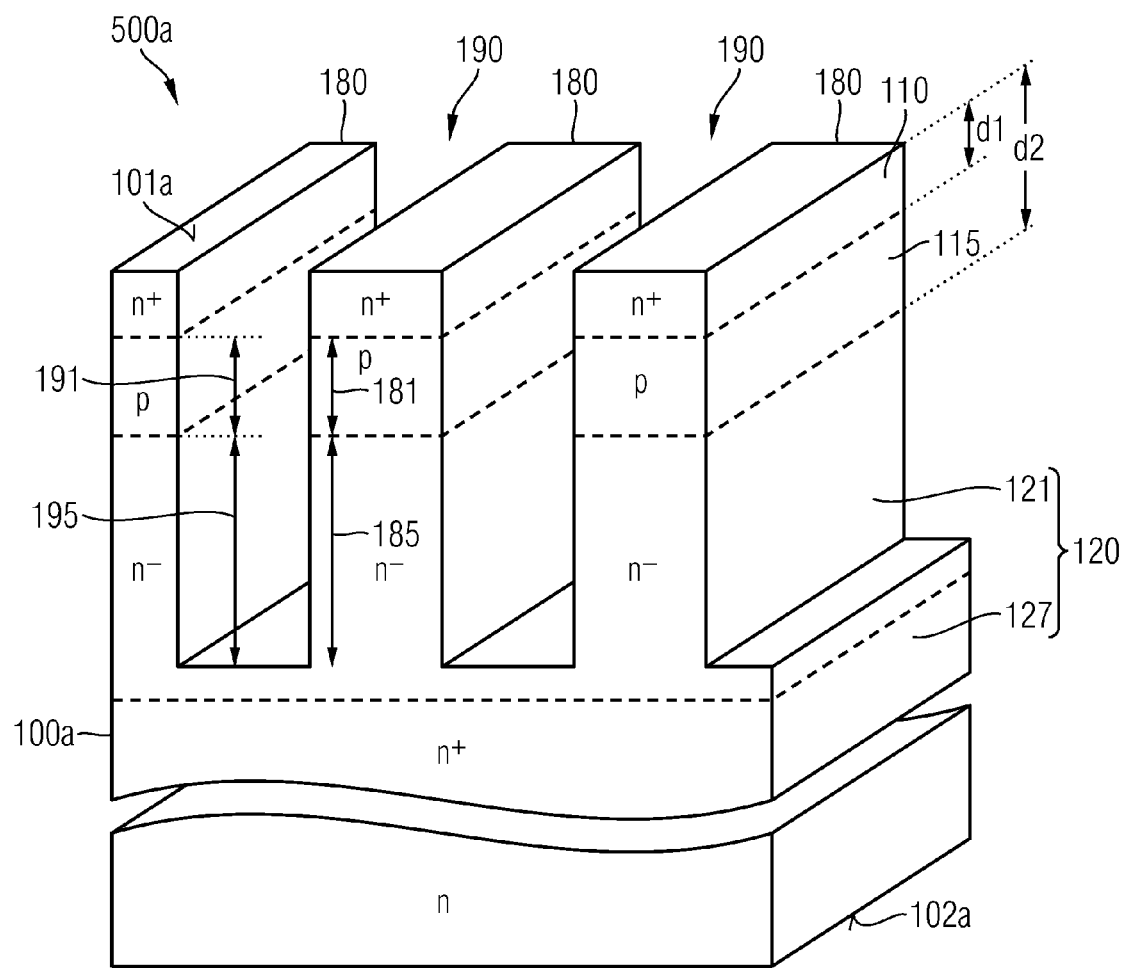
FIG. 2A refers to a further embodiment of a method of manufacturing a semiconductor device and illustrates a semiconductor substrate portion after etching cavities and forming channel/body zones in transistor fins.
Figure 2B:
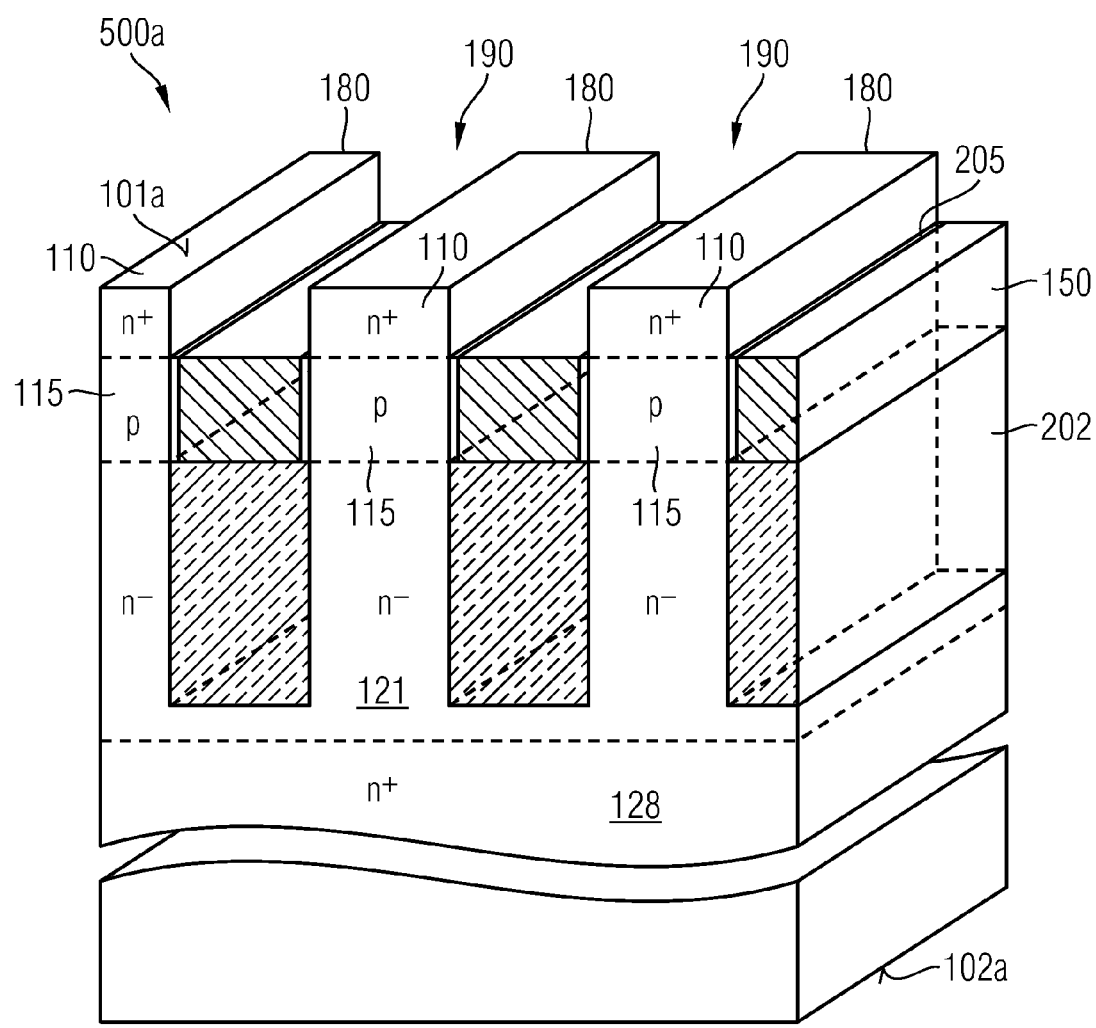
FIG. 2B is a schematic perspective view of the semiconductor substrate portion of FIG. 2B after forming gate electrodes.

FIGS. 2A to 2B refer to a method providing transistor components with a vertical arrangement of source zones 110, channel/body zones 115, and drain regions 120.

Cell trenches 190 are etched from a first surface 101a into a semiconductor layer 100a of a semiconductor substrate 500a as described in detail with reference to FIG. 1A, wherein cell fins 180 are formed from portions of the semiconductor layer 100a between the cell trenches 190. The formation of the cell trenches 190 may include several different sub-processes. At least one sub-process defining sidewall portions of the cell fins 181 between a first distance d1 and a second distance d2 to the first surface 101 includes a crystallographic etching. Formation of the cell trenches 190 may include a first dry etch, for example an ion beam etching defining precursor trenches followed by a wet etching in an appropriate etch solution containing, e.g., TMAH, KOH, or EDP. Portions of the cell fins 180 between the first and second distances d1, d2 form transistor fins 181 and portions of the cell trenches 190 between the first distance d1 and the second distance d2 form cavities 191 separating the transistor fins 181 from each other.

Before or after forming the cell trenches 190 source zones 110 of the first conductivity type may be formed between the first surface 101 and a parallel plane at the first distance d1. Channel/body zones 115 may be formed between parallel planes at the first distance d1 and the second distance d2. A drain region 120 may be formed between the plane at the second distance d2 and the second surface 102. The drain region 120 may include a heavily doped connection layer 127 which is at least partly formed below the cell trenches 190. A more lightly doped drift zone 121 is formed mainly in electrode fins 185 formed in portions of the cell fins 180 between the channel/body zones 115 and the bottom of the cell trenches 190. Portions of the cell trenches 190 between the electrode fins 185 form separation trenches 195.

The separation trenches 195 may be filled with a dielectric material. A conductive gate material may be deposited in the cavities 191 and recessed. In case of FET cells a gate dielectric 205 may be formed at least on sidewalls of the channel/body zones 115 before depositing the conductive material.

FIG. 2B shows dielectric structures 202 formed from the deposited dielectric material in the separation trenches 195 and a gate electrode 150 formed from the recessed deposited conductive gate material in the cavities 191 between the transistor fins 181. Junctions between the channel/body zones 115 and the source zones 110 as well as junctions between the channel/body zones 115 and the drain zones 120 are formed at a distance to the first surface 101a. The crystallographic etching provides approximately perfectly rectangular transistor fins 181 in a distance d1 to the first surface 101a with high reliability.

FIGS. 3A to 3F refer to a method providing buried rectangular transistor fins 181 extending between first electrode fins 185a including source zones 110 and second electrode fins 185b including drain regions 120.

A first mask layer is deposited on a first surface 101a of a semiconductor substrate 500a including a semiconductor layer 100a which may contain impurities of the first conductivity type as described with regard to FIG. 1A. Stripe-shaped separation trenches 195 with a first lateral extension significantly greater than a second lateral extension perpendicular to the first lateral extension are etched into the first mask layer to form a first mask 410. Using the first mask 410 as an etch mask, separation trenches 195 are etched from the first surface 101a into the semiconductor layer 100a using, for example, an anisotropic dry etch process, for example ion beam etching.

Figure 3A:
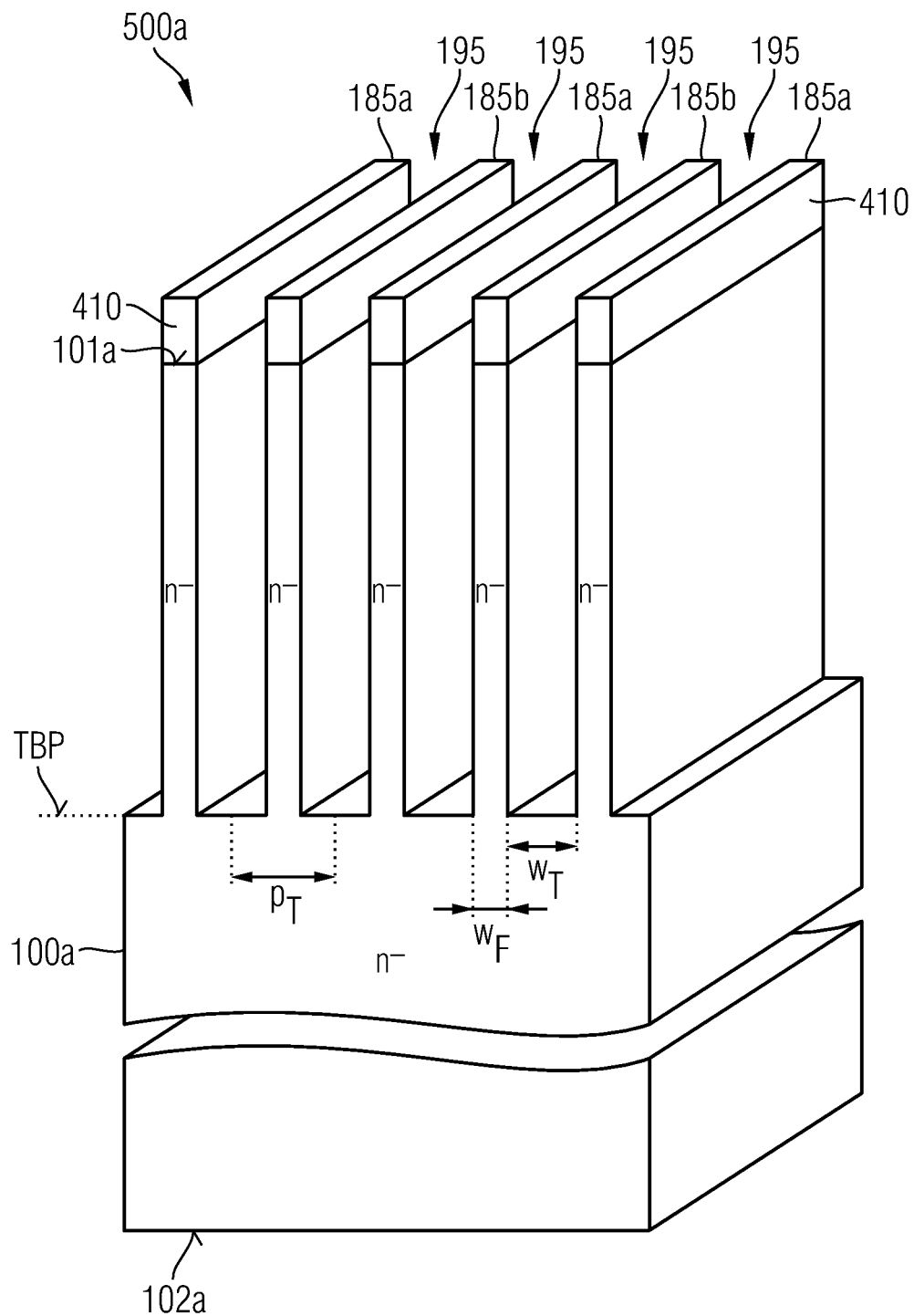
FIG. 3A refers to a further embodiment of a method of manufacturing a semiconductor device and illustrates a semiconductor substrate portion after forming separation trenches between electrode fins.

FIG. 3A shows the first mask 410 covering electrode fins 185a, 185b formed from material of the semiconductor layer 100a between the separation trenches 195.

The first mask 410 may be a silicon nitride mask, a carbon mask or a mask from any other material against which the semiconductor layer 100a can be etched with high selectivity. According to an embodiment, the first mask layer may be a silicon nitride layer with a thickness of at least 100 nm, e.g., 300 nm. The separation trenches 195 extend from the first surface 101a down to a trench bottom plane TBP. A distance between the first surface 101a and the trench bottom plane TBP may be in a range from 200 nm to 2 μm. The first electrode fins 185a may have a first fin width in a lateral direction perpendicular to their longitudinal extension and the second electrode fins 185b may have a second fin width different from the first fin width.

According to an embodiment, the first and second electrode fins 185a, 185b may have the same fin width wF. The fin width wF may be in a range from 10 nm to 200 nm. A width wT of the separation trenches 195 is equal to a distance between the electrode fins 185a, 185b and may be in a range from 30 nm to 300 nm. A trench pitch pT (center-to-center distance) of the separation trenches 195 may be in the range from 40 nm to 1 μm. Due to the properties of the etching process the bottom portions of the separation trenches 195 are typically bowed. Any curvature of the separation trenches 195 in the bottom portions next to the trench bottom plane TBP is neglected in the Figures.

A conformal mask liner 420a may be deposited on the side of the semiconductor substrate 500a defined by the first surface 101a.

Figure 3B:
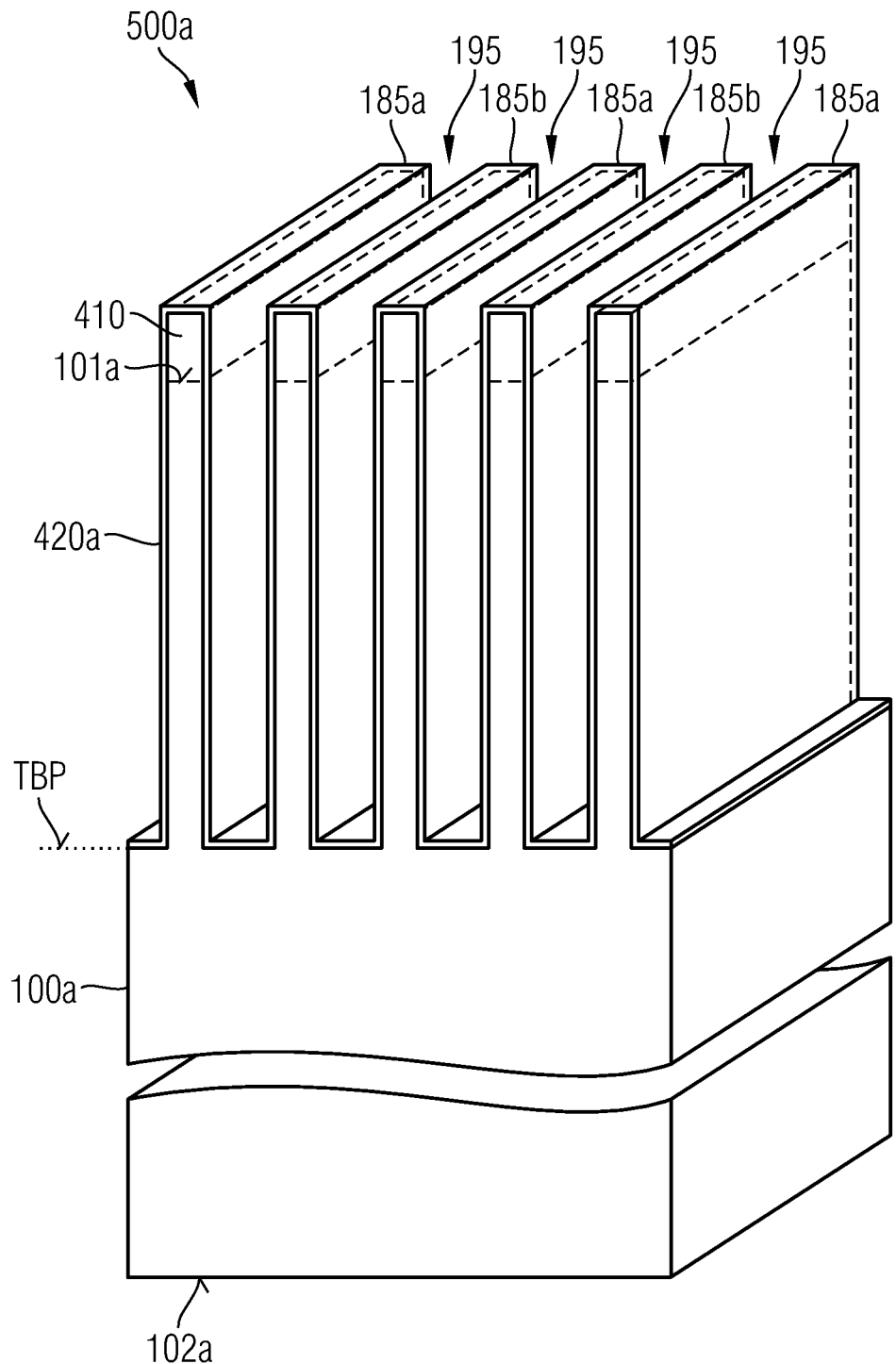
FIG. 3B is a schematic perspective view of the semiconductor substrate portion of FIG. 3A after providing a mask liner.

FIG. 3B shows the conformal mask liner 420a lining the separation trenches 195 and covering sidewalls of the electrode fins 185a, 185b as well as bottom portions of the separation trenches 195. The material of the conformal mask liner 420a may be silicon nitride, carbon or any other material against which the semiconductor material of the semiconductor layer 100a and the material of a second mask used in the following can be etched with high selectivity. According to an embodiment, the conformal mask liner 420a is a silicon nitride liner with a thickness in a range from 5 nm to 20 nm, by way of example.

A second mask layer is deposited and patterned to form a second mask 430 with comb-shaped sections running perpendicular to the electrode fins 185a, 185b. The second mask material is selected such that the semiconductor material of the semiconductor layer 100a and the material of the conformal mask liner 420a can be etched using the second mask 430 as an etch mask. For example, the material of the second mask layer is silicon oxide and the second mask 430 is formed by depositing a hard mask material, for example, polycrystalline silicon or carbon on the surface of the second mask layer, transferring the pattern of a photoresist into the hard mask material to form a hard mask and then transferring the pattern of the hard mask into the second mask layer to form the second mask 430.

A further etching, for example an anisotropic selective etch of the material of the conformal mask liner 420a, removes exposed portions of the conformal mask liner 420a at the bottom of the exposed portions of the separation trenches 195 to form a mask liner mask 420.

Figure 3C:
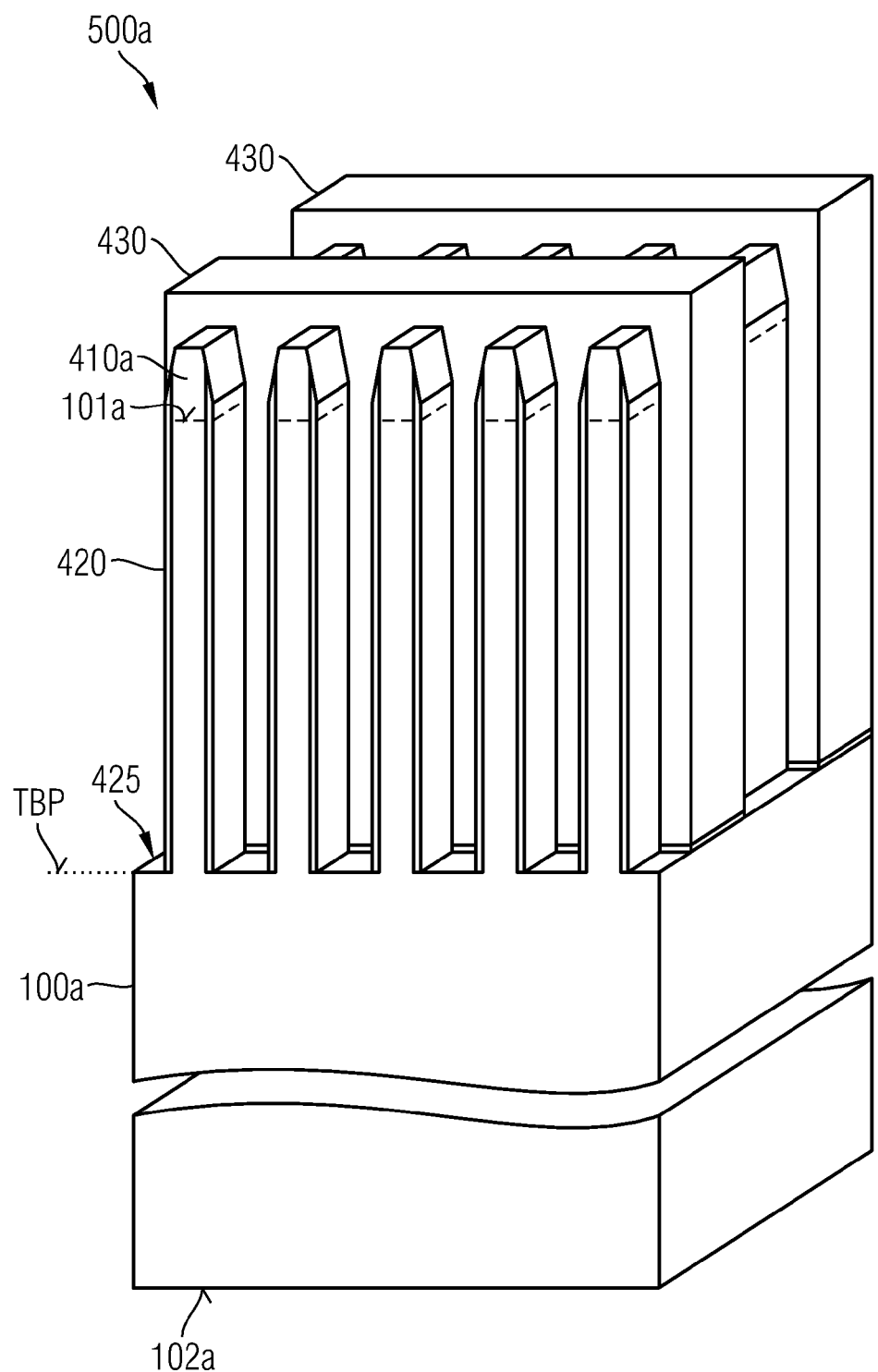
FIG. 3C is a schematic perspective view of the semiconductor substrate portion of FIG. 3B after providing a mask liner mask from the mask liner.

FIG. 3C shows comb-like sections of the second mask 430 extending in a lateral direction perpendicular to the longitudinal extension of the electrode fins 185a, 185b. Sections of the second mask 430 fill portions of the separation trenches 195. The second mask 430 exposes spatially separated portions of the mask liner 420 in each separation trench 195. Openings 425 in the mask liner mask 420 expose spatially separated portions of the semiconductor layer 100a in the vertical projection of the separation trenches 195 beyond the trench bottom plane TBP. Formation of the second mask 430 and the mask liner mask 420 may recess the first mask 410.

Using the second mask 430 and the mask liner mask 420 as a combined etch mask, precursor cavities 191a are formed in portions of the semiconductor layer 100a in the vertical projection of portions of the separation trenches 195 between the sections of the second mask 420. The precursor cavities 191a may be formed using an anisotropic dry etch process, for example ion beam etching.

Figure 3D:
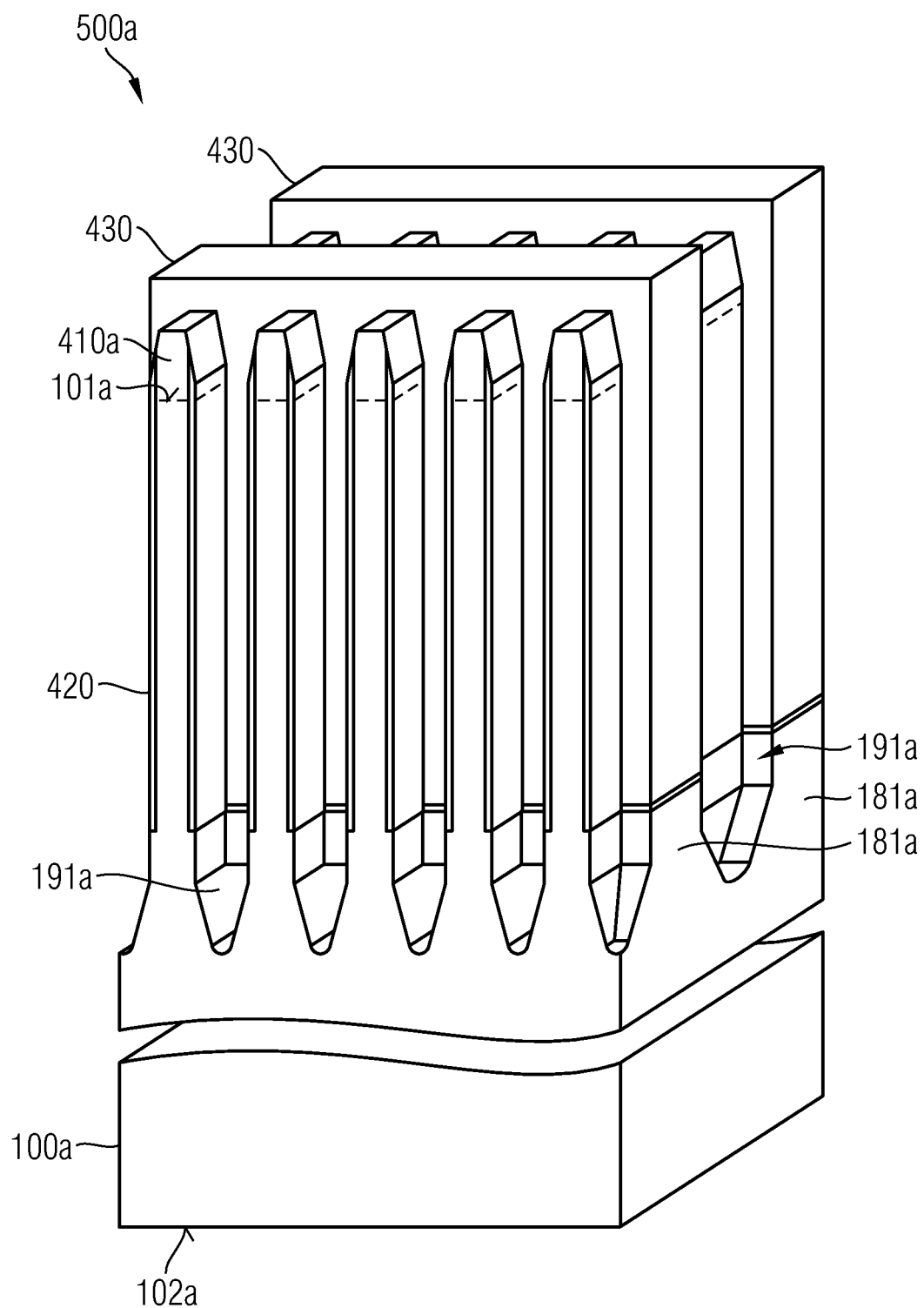
FIG. 3D is a schematic perspective view of the semiconductor substrate portion of FIG. 3C after forming provisional cavities.

FIG. 3D shows the precursor cavities 191a defined by the openings 425 in the mask liner mask 420. Due to the properties of the dry etch process the sidewalls of the precursor cavities 191a are curved or bowed.

Crystallographic etching having an etch rate that depends upon an orientation of crystal faces widens up the precursor cavities 191a. The crystallographic etching may use TMAH, KOH or EDP and may have a selectivity between the (100), (110) and (111) crystallographic planes of about 20:10:1 such that after a sufficient etch time the sidewalls of the cavities 191 are approximately perfectly vertical. The second mask 420 may be removed before or after the crystallographic etching by an appropriate wet etching process.

Figure 3E:
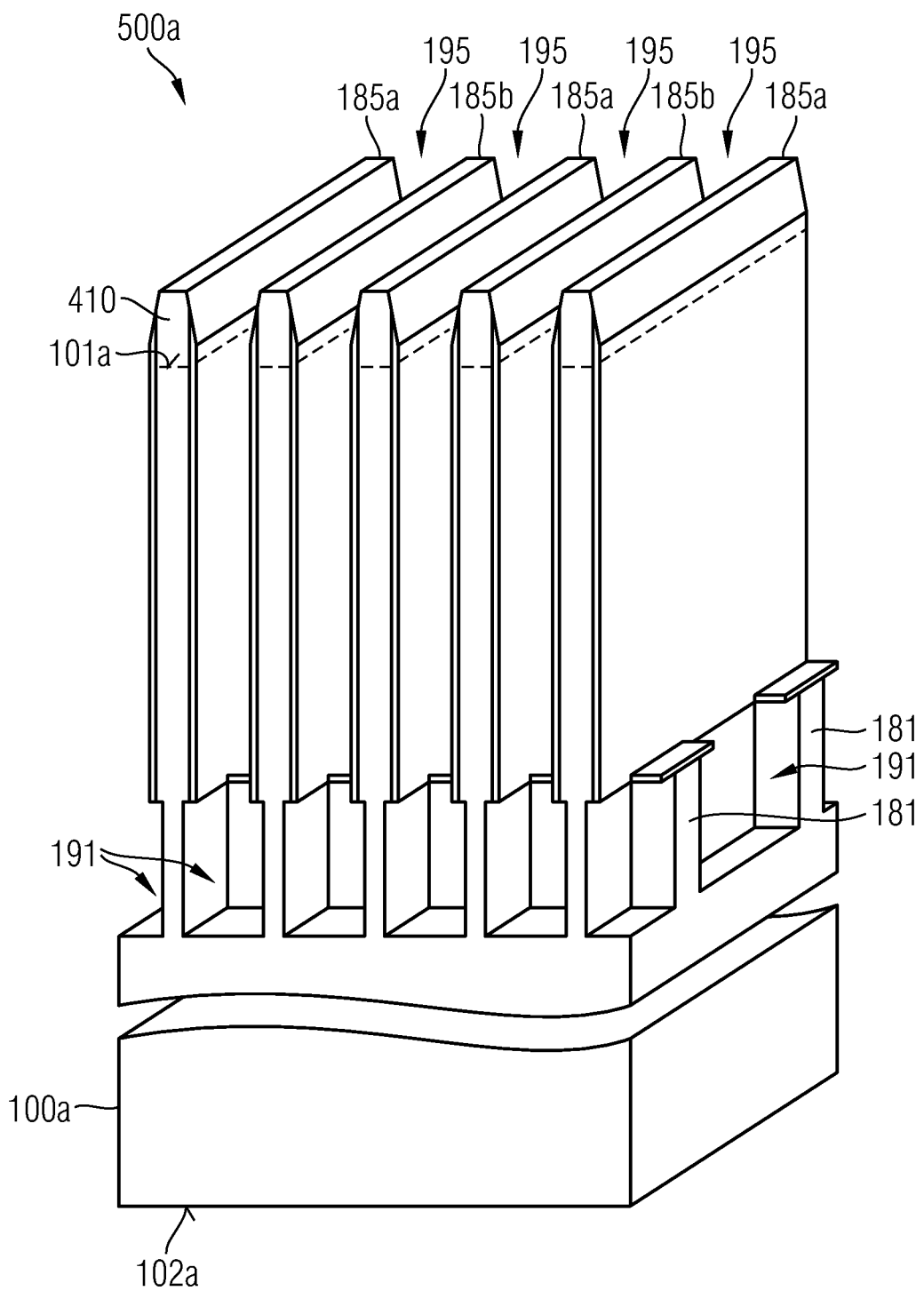
FIG. 3E is a schematic perspective view of the semiconductor substrate portion of FIG. 3D after forming cavities by crystallographic etching.
Figure 3F:
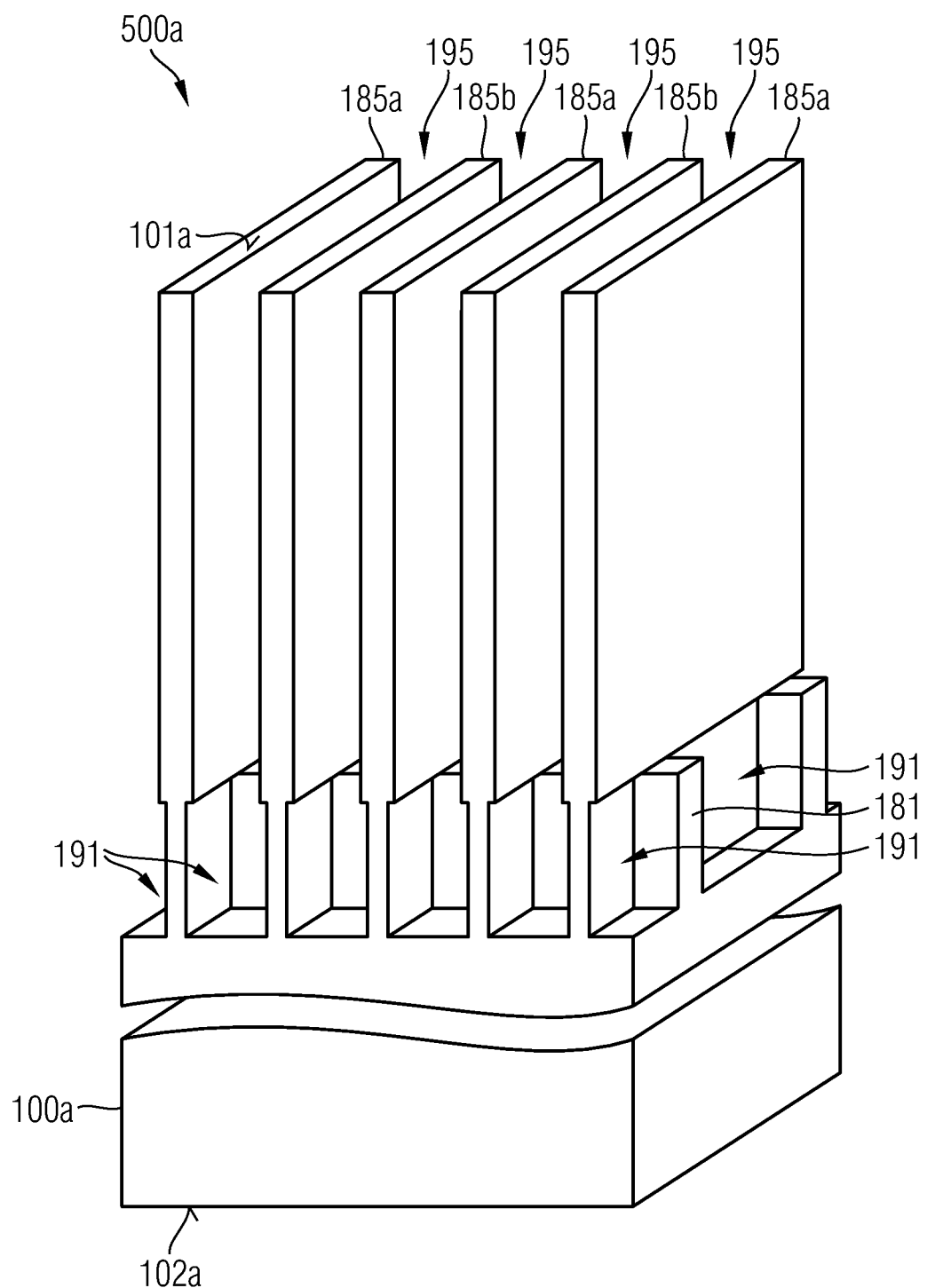
FIG. 3F is a schematic perspective view of the semiconductor substrate portion of FIG. 3D after removing the mask liner mask.

FIG. 3E shows the cavities 191 which are wider than the precursor cavities 191a of FIG. 3D and wider than the corresponding separation trenches 195. Between cavities 191 assigned to the same separation trench 195, the crystallographic etch forms well-defined transistor fins 181 with approximately vertical sidewalls and rectangular cross-section. After formation of the cavities 191, the mask liner mask 420 may be removed as shown in FIG. 3F.

Gate dielectrics may be formed at least on the vertical surfaces of the transistor fins 181 by thermal oxidation of the semiconductor material, by deposition of dielectric materials such as silicon oxide, silicon nitride or silicon oxinitride or by a combination of deposition and thermal growth. A conductive material may be deposited to fill the cavities 191 and first portions of the separation trenches 195 directly adjoining to the cavities 191. Second portions of the separation trenches 195 oriented to the first surface 101a may be filled with a dielectric material. Before, between or after the processes discussed with reference to FIGS. 3A to 3E impurities of the first and, if applicable, of the second conductivity type may be introduced into the electrode fins 185a, 185b and transistor fins 181 to form contact zones 128, channel/body zones 115 and source zones 110. Portions of the first electrode fins 185a including the source zones 110 may be replaced with a highly conductive material, e.g. heavily doped polycrystalline silicon.

Figure 4:
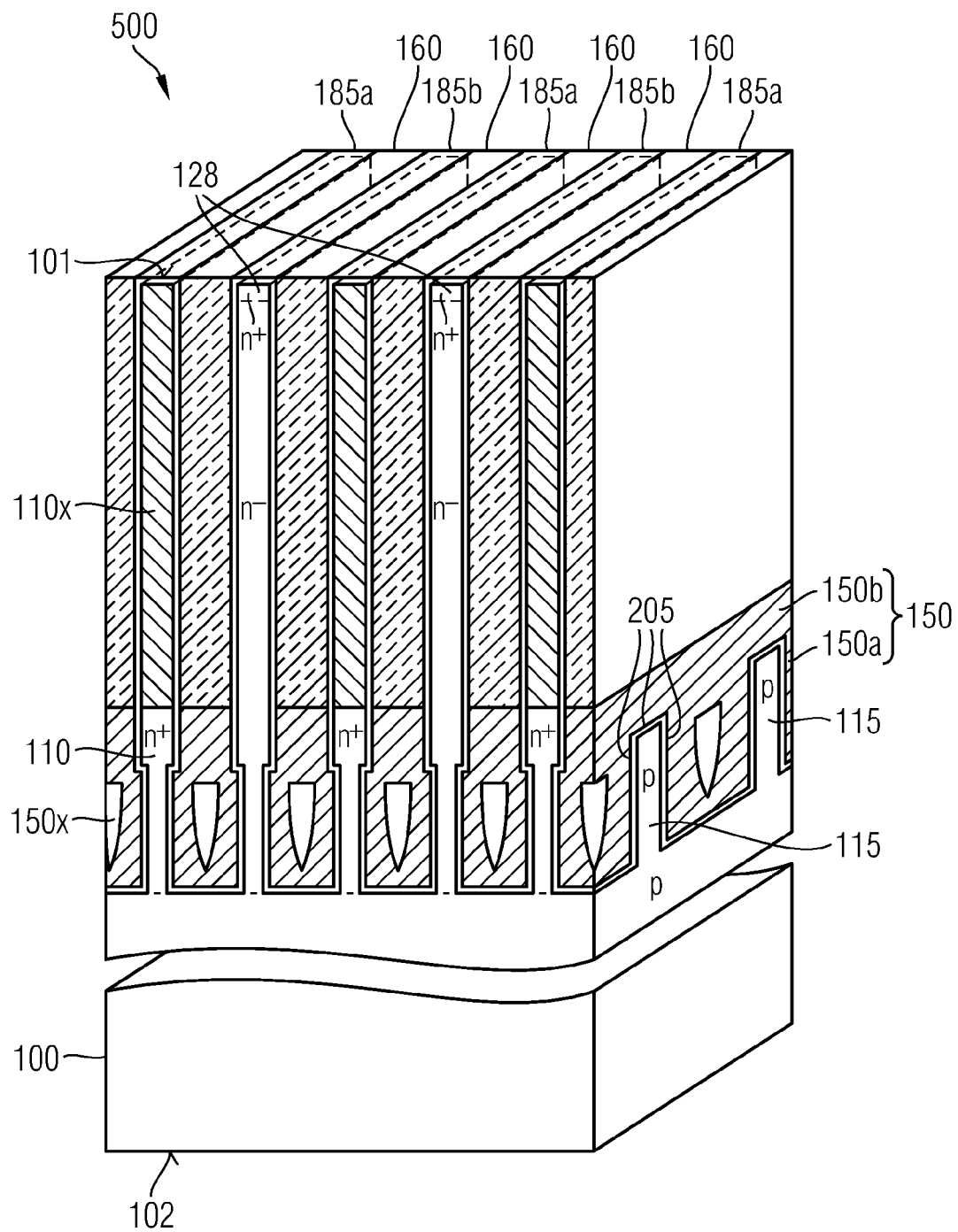
FIG. 4 is a schematic perspective view of a semiconductor device in accordance with an embodiment related to an ADZFET with channel/body zones with vertical sidewalls.

FIG. 4 shows a portion of a semiconductor device 500 which may result from the process described in detail with regard to FIGS. 3A to 3F.

The semiconductor device 500 includes a semiconductor portion 100 with a first surface 101 and an opposite second surface 102. First electrode fins 185a and second electrode fins 185b at least partly provided from the material of the semiconductor portion extend along a first lateral direction. Dielectric separation structures 160 from, e.g., silicon oxide may extend between the first and second electrode fins 185a, 185b from the first surface 101 into the semiconductor portion 100 down to a gate electrode 150. The separation structures 160 may be compact or may include voids.

In the vertical projection of each separation structure 160 buried transistor fins 181 extend between and connect the two adjoining electrode fins 185a, 185b. The transistor fins 181 may have the same conductivity type as the electrode fins 185a, 185b or the opposite conductivity type. First gate sections 150a of a gate electrode 150 are arranged between neighboring transistor fins 181 assigned to the same separation structure 160. Second gate sections 150b are formed between the separation structures 160 and the transistor fins 181, respectively and connect the first gate sections 150a assigned to the respective separation structure 160.

For transistor components based on JFET cells the gate electrode 150 may directly adjoin the transistor fins 181. For transistor components based on IGFETs, a gate dielectric 205 may dielectrically insulate the gate electrode 150 from the semiconductor portion 100.

The conductive gate material of the gate electrode 150 may be heavily doped polycrystalline silicon and may fill the space between the transistor fins 181 assigned to the same separation structure 160 completely or may leave voids 150x.

The first electrode fins 185a include heavily doped source zones 110 of the first conductivity type directly adjoining channel/body zones 115 formed in the transistor fins 181, respectively. The source zones 110 may directly adjoin the first surface 101. According to the illustrated embodiment, source plugs 110x from a non-single-crystalline semiconductor material, for example heavily doped polycrystalline silicon and/or a metal-containing material may be arranged between the first surface 101 and the source zones 110. A first metallization may electrically connect the source zones 110 or the source plugs 110x on the side of the first surface 101.

The second electrode fins 185b include heavily doped contact zones 128 of the first conductivity type directly adjoining the first surface 101 as well as lightly doped drift zones 121 connecting the channel/body zones 115 with the contact zones 128. A second metallization may electrically connect the contact zones 128 on the side of the first surface 101.

The length of the transistor fin 181 defines a channel length which can be longer than the distance between the electrode fins 185a, 185b. The perfect rectangular cross-section of the transistor fins 181 ensures a low spread of device parameters like threshold voltage.

Figure 5A:
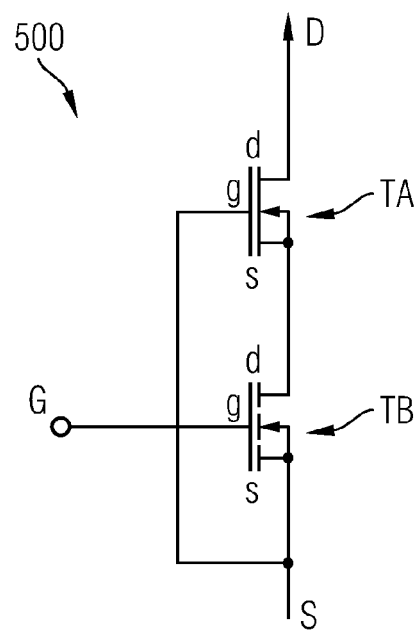
FIG. 5A is a schematic circuit diagram of a semiconductor device according to embodiments related to ADZFETs.

FIG. 5A shows an embodiment concerning a power semiconductor device 500 that may include at least two vertical transistor components, e.g., an enhancement type IGFET TB and a depletion type IGFET TA that may be arranged in cascode connection. The load paths between the sources s and drains d of the IGFETs TA, TB are arranged in series between drain and source terminals D, S of the power semiconductor device 500. A gate terminal G of the semiconductor device 500 or the output of an integrated gate driver is electrically connected or coupled to the gate electrode g of the enhancement type IGFET TB. The source s of the enhancement type IGFET TB may be electrically connected or coupled to the gate electrode g of the depletion type IGFET TA. The drain d of the enhancement type IGFET TB is electrically connected with the source s of the enhancement type IGFET TA. The IGFETs TA, TB may be n-channel IGFETs Equivalent considerations apply to p-channel IGFETs.

In a blocking mode, each of the IGFETs TA, TB sustains a portion of the total blocking voltage. In the conductive mode, the two IGFETs TA, TB, whose load paths are electrically arranged in series, may provide an on-state resistance which is lower or at least in the range of the on-state resistance of a single IGFET device having a comparable blocking voltage capability. Since the total blocking voltage can be modified by the numbers of transistors electrically arranged in series and integrated in the same semiconductor die in a lateral direction, device parameters like blocking voltage capability and on-state resistance for vertical IGFET designs can be modified without modifying the thickness of a semiconductor portion 100 through expensive grinding and polishing processes.

Figure 5B:
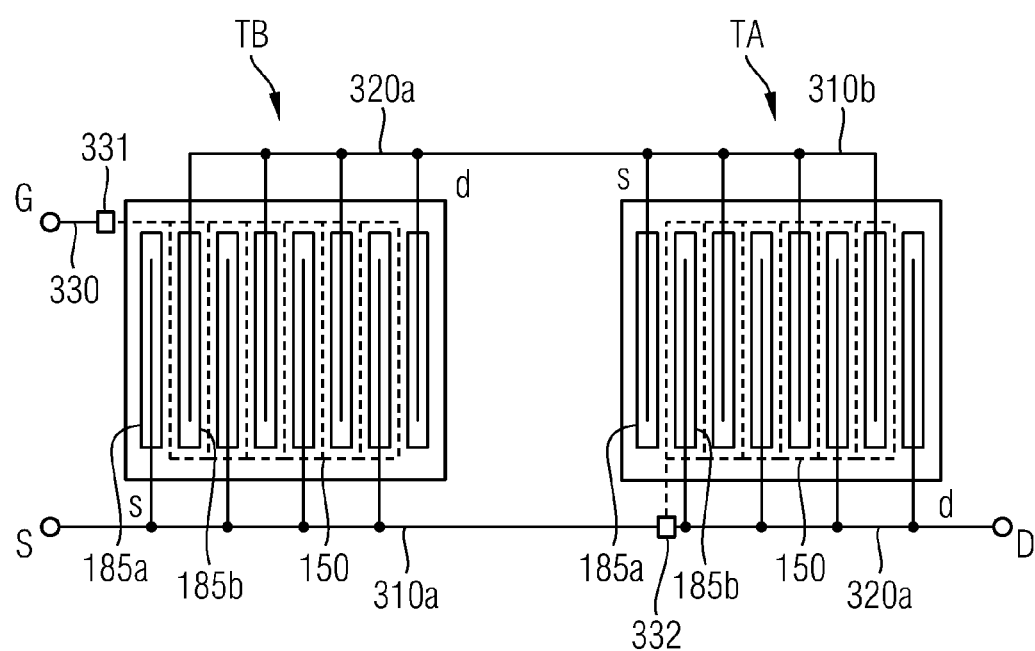
FIG. 5B is a schematic plan view of the semiconductor device according to FIG. 5A.

FIG. 5B shows a layout with the two IGFETs TA, TB of FIG. 5A realized as vertical transistor components illustrated in FIG. 4.

The buried gate electrode 150 of the enhancement type IGFET TB is electrically connected with a gate metallization 330 connected to a gate terminal G. For example, a first connection plug 331 connects the buried gate electrode 150 with the gate metallization 330. The first metallization 310a electrically connecting source zones in the first electrode fins 185a of the enhancement type IGFET TB is electrically connected to a source terminal S and to the buried gate electrode 150 of the depletion type IGFET TA, for example through a second connection plug 332. The second metallization 320a electrically connecting contact zones of drain regions in the second electrode fins 185b of the enhancement type IGFET TB is electrically connected to a first metallization 310b electrically connecting source zones in the first electrode fins 185a of the depletion type IGFET TA. The second metallization 320b electrically connecting drain regions in the second electrode fins 185b of the depletion type IGFET TA is electrically connected to a drain terminal D.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a source zone of a first conductivity type formed in a first electrode fin extending from a first surface into a semiconductor portion;
    a drain region of the first conductivity type formed in a second electrode fin extending from the first surface into the semiconductor portion; and
    a channel/body zone formed in a transistor fin extending between the first and second electrode fins at a distance to the first surface,
    wherein the first and second electrode fins extend along a first lateral direction,
    wherein a width of first gate sections arranged on opposing sides of the transistor fin along a second lateral direction perpendicular to the first lateral direction is greater than a distance between the first and second electrode fins.

2. The semiconductor device of claim 1, wherein
    the transistor fin has a rectangular cross-section in a plane parallel to the first lateral direction and perpendicular to the first surface.

3. The semiconductor device of claim 1, wherein
    sidewalk of the transistor fin extending perpendicular to the first surface are {111} crystallographic planes of a silicon crystal.

4. The semiconductor device of claim 1, wherein
    the width of the first gate sections along the second lateral direction is equal to a channel length of the channel/body zone.

5. The semiconductor device of claim 1, further comprising:
    a second gate section arranged between a plane defined by the first surface and the transistor fin and connecting the first gate sections.

6. The semiconductor device of claim 5, further comprising:
    a separation structure between the plane defined by the first surface and the second gate section.

7. The semiconductor device of claim 5, further comprising:
    a gate dielectric separating the transistor fin from a gate electrode comprising the first gate sections.

8. The semiconductor device of claim 1, wherein
    the first electrode fin further comprises a source plug between the first surface and the source zone and the source plug is formed of a non-single-crystalline semiconductor material and/or contains a metal-containing material.

9. The semiconductor device of claim 1, wherein
    the drain region comprises (i) a heavily doped contact zone directly adjoining the first surface and (ii) a lightly doped drift zone connecting the channel/body zone and the heavily doped contact zone.

10. The semiconductor device of claim 1, further comprising:
    a first transistor component comprising a plurality of the first electrode fins, the second electrode fins and the transistor fins; and
    a second transistor component electrically coupled to the first transistor component and comprising a plurality of the first electrode fins, the second electrode fins and the transistor fins.

* * * * *